US008617701B2

United States Patent
Aruga (10) Patent No.: US 8,617,701 B2
(45) Date of Patent: Dec. 31, 2013

(54) DARK TYPE FLUORORESIN FILM AND BACK SHEET FOR SOLAR CELL MODULE

(75) Inventor: Hiroshi Aruga, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/069,599

(22) Filed: Mar. 23, 2011

(65) Prior Publication Data

US 2011/0171451 A1   Jul. 14, 2011

Related U.S. Application Data

(63) Continuation of application No. PCT/JP2009/066188, filed on Sep. 16, 2009.

(30) Foreign Application Priority Data

Oct. 9, 2008   (JP) .................. 2008-262581

(51) Int. Cl.
  *B32B 27/00* (2006.01)
  *C08L 27/18* (2006.01)
  *C08K 3/04* (2006.01)
  *C08K 3/16* (2006.01)

(52) U.S. Cl.
  USPC ........... 428/220; 428/421; 524/546; 524/495; 524/413

(58) Field of Classification Search
  None
  See application file for complete search history.

(56) References Cited

U.S. PATENT DOCUMENTS

| 2,997,451 A | * | 8/1961 | Miller .......................... 428/64.2 |
| 5,849,829 A | * | 12/1998 | Buegman ....................... 524/449 |
| 2003/0198770 A1 | * | 10/2003 | Fukushi et al. ............. 428/36.91 |
| 2004/0116606 A1 | * | 6/2004 | Sumi et al. .................... 525/199 |
| 2007/0181251 A1 | * | 8/2007 | Ikeda et al. .................... 156/294 |
| 2010/0092759 A1 | * | 4/2010 | Fan et al. ....................... 428/323 |
| 2010/0096772 A1 | | 4/2010 | Okuya et al. |
| 2010/0151180 A1 | * | 6/2010 | Bravet et al. ..................... 428/76 |

FOREIGN PATENT DOCUMENTS

| CN | 1112732 A | 11/1995 |
| CN | 1182963 A | 5/1998 |
| CN | 1531763 A | 9/2004 |
| EP | 1 182 710 A1 | 2/2002 |
| JP | 58-112712 | 7/1983 |
| JP | 03-188132 | 8/1991 |
| JP | 06-196742 | 7/1994 |

(Continued)

OTHER PUBLICATIONS

Denka Black Product Information. http://www.denka.co.jp/eng/moreinfo/more043.html. Retrieved Nov. 2, 2011.*

(Continued)

*Primary Examiner* — Prashant J Khatri
(74) *Attorney, Agent, or Firm* — Oblon, Spivak, McClelland, Maier & Neustadt, L.L.P.

(57) ABSTRACT

A fluororesin film usable as the outermost layer of a back sheet for a solar cell module, which is a dark type fluororesin film having a sufficient electric insulation property and weather resistance, and which is particularly excellent in thermal resistance; and a back sheet for a solar cell module employing such a film, which dark type fluororesin film, which is a fluororesin film contains an ethylene-tetrafluoroethylene copolymer as the main component and contains from 1.0 to 4.5 parts by mass of a carbon black having a pH of from 8 to 10 as measured according to JIS K6221 section 6.4.2 based on 100 parts by mass of the ethylene-tetrafluoroethylene copolymer.

17 Claims, 1 Drawing Sheet

(56) References Cited

FOREIGN PATENT DOCUMENTS

| | | |
|---|---|---|
| JP | 07-120811 | 12/1995 |
| JP | 2002-265642 | 9/2002 |
| JP | 2002-273837 | 9/2002 |
| JP | 2006-108080 A | 4/2006 |
| JP | 2007-150084 | 6/2007 |
| JP | 2008-4839 | 1/2008 |
| JP | 2008-163139 | 7/2008 |
| WO | WO 2008/053632 A1 | 5/2008 |

OTHER PUBLICATIONS

Wang et al. "Carbon Black". Kirk-Othmer Encyclopedia of Chemical Technology, (2003); pp. 761-803.*

Machine translation of JP2002-273837. Retrieved Nov. 22, 2012.*

International Search Report issued Nov. 24, 2009 in PCT/JP09/066188 filed Nov. 11, 2009.

U.S. Appl. No. 13/114,204, filed May 24, 2011, Aruga.

Extended Search Report issued Mar. 7, 2012 in Europe Application No. 09819077.0.

Combined Chinese Office Action and Search Report Issued Oct. 17, 2012 in Patent Application No. 200980140131.7 (with English translation and English translation of Categories of Cited Documents).

Zhao-yuan Shi et al., "Study on structure and performance of a self-humidifying membrane electrode assembly in PEMFC", China Academic Journal Electronic Publishing House, Jun. 20, 2006, 4 pages (with English abstract).

* cited by examiner

DARK TYPE FLUORORESIN FILM AND BACK SHEET FOR SOLAR CELL MODULE

TECHNICAL FIELD

The present invention relates to a dark type fluororesin film and a back sheet for a solar cell module.

BACKGROUND ART

While consumption of fossil fuel increases carbon dioxide in the air to remarkably cause deterioration of global environment, a solar cell is a semipermanent environment-friendly energy source since it uses solar light. For this reason, development of various types of solar cells has been attempted as development of future important energy sources. A solar cell is commonly employed in a form of a solar cell module wherein a solar cell element is sealed by an EVA (ethylene-vinyl acetate copolymer) and sandwiched between a transparent glass substrate and a back sheet (rear surface laminate) covering its front surface and rear surface, respectively.

The back sheet is provided to protect the EVA and the solar cell element, and a film to be employed as its outermost layer has to have a sufficient electric insulation property (volume resistivity: at least $1 \times 10^{13}$ Ω·cm) and a sufficient moisture-proof property (water vapor permeation is at most 1 g/m$^2$·24 h at 40° C. with a relative humidity of 90%).

Further, since a solar cell module is exposed to outdoor environment for a long time, the back sheet has to have a sufficient durability.

Specifically, since exposure to a carbon arc type sunshine weather meter (SWM) for from 250 to 500 hours corresponds to one year of exposure to outdoor environment, it has been necessary to suppress strength reduction by 5,000 hour exposure to SWM (corresponding to from 10 to 20 years) to be at most a half of the initial strength. Further, since the actual temperature of a solar cell is at most about 90° C., the solar cell has been required to have a thermal resistance sufficient for suppressing strength reduction under 90° C., 20 year use to be a degree causing no practical problem.

As a film to be employed as the outermost layer of the back sheet, a fluororesin film employing a fluororesin such as ETFE (ethylene-tetrafluoroethylene copolymer), PVF (polyvinyl fluoride) and PVDF (polyvinylidene fluoride), that have the above properties, have been known. Among these, an ETFE film or a PVDF film undergoes no reduction of strength due to hydrolysis even under the condition of 85° C., a relative humidity of 85% for 1,000 hours. Further, with an ETFE film, the temperature at which the elongation degree lowers to a half by a thermal resistance test of 100,000 hours (about 10 years), is about from 150 to 160° C.

As a back sheet employing such a fluororesin film as the outermost layer, a white film is mainly employed, but from the viewpoint of improving a design, a fluororesin film containing a black pigment such as a carbon black has also been shown (for example, refer to Patent Documents 1 and 2). Further, in an amorphous type solar cell, since deterioration of its solar cell element due to light can be suppressed by maintaining the temperature of the solar cell to be high to a certain extent, an embodiment of containing a black pigment is shown (refer to Patent Document 3).

PRIOR ART DOCUMENTS

Patent Documents

Patent Document 1: JP-A-2008-4839
Patent Document 2: JP-A-2007-150084
Patent Document 3: JP-A-7-120811

DISCLOSURE OF INVENTION

Technical Problem

In recent years, installations of solar cell modules integrated with roofs has been decreased, and installation of solar cells obliquely at an optimum angle according to the latitude of installation site so that its transparent glass substrate faces to the sun, have been increased. In such an installation method, since a large amount of reflected solar light is radiated to a back sheet on a rear surface of such a solar cell module, a fluororesin film disposed as its outermost layer is required to have more excellent light resistance, thermal resistance, etc. Further, in the back sheet of a solar cell module, since the fluororesin film alone cannot sufficiently suppress permeation amount of water vapor, an aluminum foil or a moisture-proof plastic sheet is laminated with the fluororesin film to shield water vapor penetrating into the solar cell module. Accordingly, from the viewpoint of protecting from sun light an adhesive agent and a plastic sheet to be employed for the lamination, such a fluororesin film is required to have a UV-light transmittance of less than 1% in a wavelength region of 360 nm or shorter in recent years.

Further, besides such oblique installation of solar cell modules, its quality warranty term has been extended to 30 years. For these reasons, a fluororesin film having a durability more excellent than the fluororesin films of Patent Documents 1 to 3 and having an UV-light transmittance of less than 1% in a wavelength region of 360 nm or shorter, have been desired.

It is an object of the present invention to provide a fluororesin film capable of being employed as the outermost layer of a back sheet for a solar cell module, which is a dark type fluororesin film, which has an UV-light transmittance of less than 1% in a wavelength region of 360 nm or shorter, which has a sufficient electrical insulating property and weather resistance, and which is particularly excellent in the thermal resistance. Further, it is an object of the present invention to provide a back sheet for a solar cell module, which has an excellent durability and which can stably protect a solar cell module for a long time.

Solution to Problem

The dark type fluororesin film of the present invention provides a fluororesin film to be used for a back sheet for a solar cell module, and provides a back sheet for solar cell module, which have the following constructions.

[1] A dark type fluororesin film, which is a fluororesin film to be used for a back sheet of a solar cell module, which contains an ethylene-tetrafluoroethylene copolymer as the main component and contains from 1.0 to 4.5 parts by mass of a carbon black having a pH of from 8 to 10 as measured according to JIS K6221 section 6.4.2 based on 100 parts by mass of the ethylene-tetrafluoroethylene copolymer.

[2] The dark type fluororesin film according to the above [1], wherein the carbon black has a specific surface area of from 30 to 150 m$^2$/g in terms of nitrogen adsorption as measured according to JIS K6217.

[3] A back sheet for a solar cell module comprising a laminate having the dark type fluororesin film as defined in the above [1] or [2] wherein the carbon black is an acetylene black or a furnace black.

[4] A back sheet for a solar cell module comprising a laminate having the dark type fluororesin film as defined in any one of the above [1] to [3], wherein the fluororesin film further contains a copper compound in an amount of from $1 \times 10^{-4}$ to $5 \times 10^{-2}$ parts by mass based on 100 parts by mass of the ethylene-tetrafluoroethylene copolymer.

[5] A back sheet for a solar cell module comprising a laminate having the dark type fluororesin film as defined in any one of the above [1] to [4], wherein the fluororesin film has a transmittance of less than 1% for UV rays having a wavelength of 360 nm or shorter.

[6] A back sheet for a solar cell module comprising a laminate having the dark type fluororesin film as defined in any one of the above [1] to [5], wherein the fluororesin film has a volume resistivity of at least $1 \times 10^{13}$ Ω·cm.

[7] A back sheet for a solar cell module comprising a laminate having the dark type fluororesin film as defined in any one of the above [1] to [6] as the outermost layer.

[8] The back sheet for a solar cell module according to the above [7], wherein the laminate comprises the dark type fluororesin film, an adhesive layer and a moisture-proof layer laminated in this order.

[9] The back sheet for a solar cell module according to the above [7], wherein the laminate comprises the dark type fluororesin film, an adhesive layer, a moisture-proof layer and a fluororesin film laminated in this order.

[10] The back sheet for a solar cell module according to any one of the above [7] to [9], wherein the dark type fluororesin film has a thickness of from 12 to 100 μm.

Advantageous Effects of Invention

The dark type fluororesin film of the present invention is a film which can be employed as the outermost layer of a back sheet for a solar cell module, which has an UV-light transmittance of less than 1% in a wavelength region of 360 nm or shorter, which has a sufficient electric insulation property and weatherability, and which is particularly excellent in thermal resistance.

Further, the back sheet for solar cell module of the present invention employs the above dark type fluororesin film as the outermost layer and thus has an excellent durability, whereby the back sheet can stably protect a solar cell module for a long time.

DESCRIPTION OF EMBODIMENTS

Dark Type Fluororesin Film

The dark type fluororesin film of the present invention (hereinafter simply referred to as "fluororesin film") is a film containing an ethylene-tetrafluoroethylene copolymer (ETFE) as the main component, and further contains a carbon black. The fluororesin film containing an ETFE as the main component preferably contains the ETFE in an amount of at least 90 mass %, more preferably at least 98 mass %, particularly preferably 100 mass % in terms of mass percentage based on the entire resin 100 mass % constituting the film.

(Ethylene-Tetrafluoroethylene Copolymer)

The ETFE has a repeating unit based on tetrafluoroethylene (hereinafter referred to as "TFE") and a repeating unit based on ethylene. The molar ratio (TFE/ethylene) of these components is preferably from 20/80 to 80/20, more preferably from 30/70 to 70/30, further preferably from 40/60 to 60/40.

The ETFE may contain besides the repeating units based on TFE and ethylene, a repeating unit based on another monomer.

Such another monomer may, for example, be a fluoroethylene (except TFE) such as $CF_2=CFCl$ or $CF_2=CH_2$; a fluoropropylene such as $CF_2=CFCF_3$(HFP) or $CF_2=CHCF_3$; a polyfluoroalkylethylene represented by $X(CF_2)_nCY=CH_2$ (here, X and Y each independently represents a hydrogen atom or a fluorine atom, n is an integer of from 2 to 8); a perfluoro vinyl ether such as $R^f(OCFXCF_2)_mOCF=CF_2$ (here, $R^f$ is a $C_{1-6}$ perfluoroalkyl group, X is a fluorine atom or a trifluoromethyl group, m is an integer of from 0 to 5); a perfluoro vinyl ether having a group easily transformable into a carboxylic group or a sulfonic group, such as $CH_3C(=O)CF_2CF_2CF_2$ $OCF=CF_2$ or $FSO_2CF_2CF_2OCF(CF_3)CF_2OCF=CF_2$; a perfluoro vinyl ether having an unsaturated bond such as $CF_2=CFOCF_2CF=CF_2$ or $CF_2=CFO(CF_2)_2CF=CF_2$; a fluoromonomer having an alicyclic structure such as perfluoro(2,2-dimethyl-1,3-dioxole) (PDD), 2,2,4-trifluoro-5-trifluoromethoxy-1,3-dioxole or perfluoro(2-methylene-4-methyl-1,3-dioxolane); or an olefin (except ethylene) such as a $C_3$ olefin (propylene, etc.) or $C_4$ olefin (butylenes, isobutylene, etc.).

In the polyfluoroalkylethylene represented by $X(CF_2)_nCY=CH_2$, n is preferably from 2 to 6, more preferably from 2 to 4. Its specific example may be $CF_3$ $CF_2$ $CH=CH_2$, $CF_3$ $CF_2CF_2$ $CH=CH_2$, $CF_3$ $CF_2CF_2CF_2CF=CH_2$, $CF_2HCF_2CF_2CF=CH_2$ or $CF_2$ $HCF_2CF_2CF=CH_2$.

A specific example of perfluoro vinyl ether such as $R^f(OCFXCF_2)_mOCF=CF_2$, may be perfluoro(methyl vinyl ether), perfluoro(ethyl vinyl ether) (PEVE), perfluoro(propyl vinyl ether) (PPVE), $CF_2=CFOCF_2CF(CF_3)O(CF_2)_2CF_3$, $CF_2=CFO(CF_2)_3O(CF_2)_2CF_3$, $CF_2=CFO(CF_2CF(CF_3)O)_2(CF_2)_2CF_3$ or $CF_2=CFOCF_2CF(CF_3)O(CF_2)_2CF_3$.

Said another monomer in the ETFE is preferably the polyfluoroalkylethylene, HFP or PPVE, more preferably HFP, PPVE, $CF_3$ $CF_2$ $CH=CH_2$ or $CF_3$ $(CF_2)_3$ $CH_2=CH$.

These other monomers may be each used alone or at least two types of them may be used in combination.

The proportion of the repeating units based on said another monomer is preferably at most 10 mol %, more preferably at most 6 mol %, further preferably at most 3 mol % based on the entire repeating units (100 mol %) of the ETFE.

The number average molecular weight of the ETFE is not particularly limited, and it is preferably from $1 \times 10^5$ to $5 \times 10^5$, more preferably $2 \times 10^5$ to $4 \times 10^5$. When the number average molecular weight of the ETFE is at least $1 \times 10^5$, strength reduction in the heat resistance test can be suppressed. Further, when the number average molecular weight of the ETFE is at most $5 \times 10^5$, formation of a thin film of about 10 μm is easy.

A usable polymer other than the ETFE may, for example, be a fluorovinyl polymer, a fluorovinylidene polymer, a fluorovinylidene-hexafluoropropylene copolymer, a tetrafluoroethylene-hexafluoropropylene-fluorovinylidene copolymer, a tetrafluoroethylene-propylene copolymer, a tetrafluoroethylene-fluorovinylidene-propylene copolymer, a hexafluoropropylene-tetrafluoroethylene copolymer or a perfluoro(alkyl vinyl ether)-tetrafluoroethylene copolymer.

(Carbon Black)

As the carbon black, acetylene black or furnace black is preferably employed. Acetylene black is excellent in purity, and furnace black is excellent in low price and availability. A type of carbon black may be used alone or at least two types of carbon blacks may be used in combination.

The carbon black of the present invention is a carbon black having a pH of from 8 to 10 measured according to JIS K6221 section 6.4.2. Further, the above pH of the carbon black is preferably from 8 to 10.

By employing a carbon black having a pH of from 8 to 10, it is possible to obtain a fluororesin film particularly excellent in thermal resistance. Further, a carbon black having a pH of at least 8 contains less amount of oxygen functional groups and nitrogen functional groups and less amount of impurities on a surface of the carbon black as compared with a carbon black having a pH of from 2 to 7 which is produced from petroleum or a carbon black to which functional groups are intentionally added by using an acid solution such as a nitric acid. Such functional groups tend to react with an ETFE, whereby heat-generation tends to occur a time of kneading to rise the temperature of a kneaded product. When the amount of such functional groups is small, the temperature control at the time of kneading becomes easy. Further, it is considered to become easy to satisfactory disperse the carbon black to the hydrophobic ETFE.

Further, when the ETFE is kneaded at a temperature of at least its melting point, a slight amount of fluororesin film is decomposed to produce HF (hydrofluoric acid). Since such HF decomposes the ETFE polymer to reduce its molecular weight in e.g. the thermal resistance test, such HF may function as an initiator of reduction of the strength or the degree of elongation of the fluororesin film. Further, when the fluororesin film is laminated with a moisture-proof plastic sheet or an aluminum foil, such HF decreases the molecular weight of an adhesive agent employed for the lamination, to reduce the bonding strength. However, it is considered that by using an alkaline carbon black having a pH of at least 8, the carbon black immediately neutralizes such produced HF to prevent the reduction of the strength or the degree of elongation of the fluororesin film. Such an acid-scavenging effect becomes more significant when a carbon black having a pH of at least 9 is employed.

In the fluororesin film of the present invention, zinc oxide or magnesium oxide that is commonly used as an acid scavenger for e.g. fluororubber cannot produce a sufficient acid-scavenging effect, but it has discovered that by using the above-mentioned alkaline carbon black, a sufficient acid-scavenging effect is obtained.

Further, the carbon black of the present invention preferably has a specific surface area of from 30 to 150 m$^2$/g, more preferably from 50 to 140 m$^2$/g, further preferably from 40 to 135 m$^2$/g in terms of specific surface area of nitrogen adsorption measured according to JIS K6217.

When the above specific surface area is at least 30 m$^2$/g, such a carbon black is excellent in the availability. Further, if the specific surface area is too large, since the particle size of the carbon black is too small, such carbon black particles tend to be agglomerated. As a result, the dispersion property of the carbon black becomes insufficient, or such an agglomerated product may cause reduction of the strength or the degree of elongation of the fluororesin film. On the other hand, when the specific surface area is at most 150 m$^2$/g, it is easy to control such problems. Further, since a sufficient bulk density can be obtained, handling of the carbon black becomes easy. Further, the ETFE is decomposed at a temperature of at least 350° C., but when the specific surface area is at most 150 m$^2$/g, it is easy to suppress a rapid temperature rise due to heat generation at a time of kneading, whereby it becomes easy to stably carry out kneading while controlling the temperature.

The content of the carbon black in the fluororesin film is from 1.0 to 4.5 parts by mass, preferably from 1.0 to 4.0 parts by mass, more preferably from 1.0 to 3.5 parts by mass, further preferably from 1.5 to 3.0 parts by mass based on 100 parts by mass of the ETFE. When the content of the carbon black is at least 1.0 parts by mass based on 100 parts by mass of the ETFE, the effect of the carbon black is sufficiently obtained. Further, although the reason is unclear, if the content of the carbon black exceeds 4.5 parts by mass based on 100 parts by mass of the ETFE, no improvement of physical properties in the thermal resistance test is observed.

Further, in the fluororesin film of the present invention, the ETFE may contain an additive other than carbon black.

As such an additive, a copper compound such as copper oxide or copper iodide is mentioned. By mixing such a copper compound, the thermal resistance of a fluororesin film to be obtained further improves. The particle size of such a copper compound is preferably from 1 to 50 μm. Further, the content of the copper compound in the fluororesin film is preferably from $1 \times 10^{-4}$ to $5 \times 10^{-2}$ parts by mass (1 to 500 ppm), more preferably from $5 \times 10^{-4}$ to $3 \times 10^{-2}$ parts by mass (5 to 300 ppm), the most preferably from $1 \times 10^{-3}$ to $2 \times 10^{-2}$ parts by mass (10 to 200 ppm) based on 100 parts by mass of the ETFE.

Further, the ETFE may contain an oxide pigment such as titanium oxide, iron oxide or a blue aluminum cobalt oxide.

The shape and the thickness of the fluororesin film is not particularly limited, and the thickness is preferably from 12 to 100 μm, more preferably from 20 to 50 μm.

Since the fluororesin film of the present invention contains at least 1.0 parts by mass of carbon black based on 100 parts by mass of the ETFE, the transmittance for UV rays having a wavelength of 360 nm or shorter is preferably less than 1%, more preferably at most 0.5%, the most preferably at most 0.1%. For this reason, when the fluororesin film is employed as the outermost layer of a back sheet for a solar cell module, it is possible to sufficiently protect an adhesive agent or a moisture-proof plastic sheet employer for the back sheet. Further, since the fluororesin film contains at least 1.0 parts by mass of carbon black based on 100 parts by mass of the ETFE, the fluororesin film is preferably a black film having a visible light transmittance of less than 10%, and in this case, an excellent concealing property is exhibited. The visible light transmittance is more preferably at most 5%, the most preferably at most 1%.

With respect to electric insulation property, a thin fluororesin film alone is not required to have a high insulation performance. However, it is not preferred that its volume resistivity drastically changes by a weatherability test or a thermal resistance test. Usually a fluororesin film whose these properties change by 10 times or more cannot be employed as a back sheet for a solar cell. The fluororesin film of the present invention preferably has a volume resistivity of at least $1 \times 10^{13}$ Ω·cm, and in this case, it has a sufficient electric insulating property, and the value does not drastically change by a weatherability test or a thermal resistance test. The volume resistivity is more preferably at least $5 \times 10^{13}$ Ω, the most preferably at least $1 \times 10^{14}$ Ω.

(Production Process)

The method for kneading the ETFE and the carbon black and as the case requires a copper compound or an oxide pigment, is not particularly limited, and a known method may be used. For example, a method of blending predetermined amounts of the ETFE, the carbon black etc., and extruding such a mixture by using a twin screw extruder to carry out kneading, may be used.

Further, in order to disperse the carbon black in the ETFE, it is necessary to knead such mixture at a temperature higher than the melting point of the ETFE. And accordingly, if the dispersion state is poor, the temperature of the resin becomes by a few tens of degrees higher than the predetermined temperature, and it becomes close to the decomposition temperature (350° C.) of the resin in some cases. The temperature at the time of kneading is preferably from 300 to 340° C.

Further, the method of shaping the fluororesin film is not particularly limited, and a known shaping method is used. For example, a method of extruding the resin material kneaded by the above kneading method by using an extruder having a T die, to shape the resin material, may be used.

The fluororesin film of the present invention described above has a specific hydrolysis resistance, a sufficient electric insulation property, a sufficient light resistance and a sufficient weather resistance, it permeates little water vapor, and it is particularly excellent in the thermal resistance. This is considered to be because besides the film is a fluororesin film employing ETFE, it contains a carbon black having a pH of from 8 to 10, whereby the thermal resistance is drastically improved.

It is known that a carbon black has a radical-capturing function, and it is considered that such a function may improve the thermal resistance or the weather resistance of the fluororesin film.

On the other hand, when some type of carbon black is employed, the thermal resistance or the weather resistance of the fluororesin film may be deteriorated due to thermal deterioration of ETFE caused by the effect of poor dispersion state or an abnormal heat generation at the time of dispersion. Namely, although the study of a film satisfying both thermal resistance and weather resistance, that are required properties for a back sheet for a solar cell, has been insufficient, the present inventors have discovered that by employing a carbon black satisfying a condition of pH 8 to 10, the thermal resistance of a fluororesin film employing an ETFE is improved. Further, by employing a carbon black having a specific surface area of from 30 to 150 m$^2$/g, it is possible to stably obtain a fluororesin film excellent in thermal resistance.

[Back Sheet for Solar Cell Module]

Figure 1:
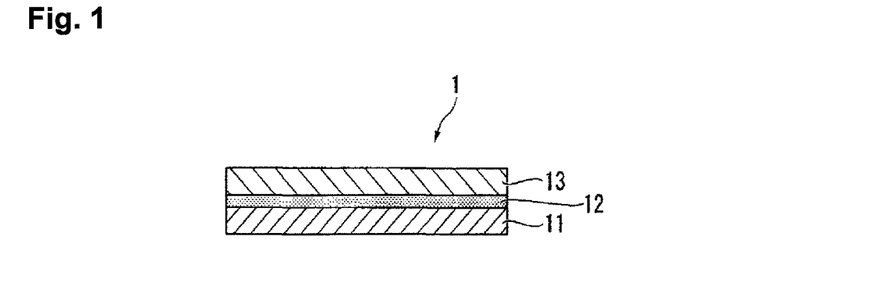
FIG. 1 is a cross-sectional view showing an embodiment example of a back sheet for a solar cell module of the present invention.
Figure 2:
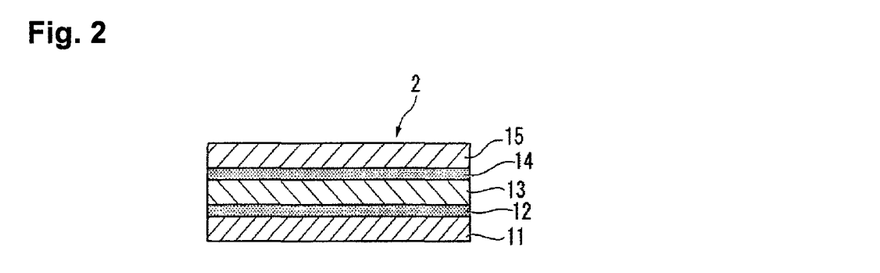
FIG. 2 is a cross-sectional view showing another embodiment example of a back sheet for a solar cell module of the present invention.

A back sheet for a solar cell module of the present invention (hereinafter referred to as "back sheet") is a laminate having the above-mentioned fluororesin film of the present invention at least as the outermost layer. An example of an embodiment of the back sheet of the present invention will be shown and described in detail. FIG. 1 is a view showing a back sheet 1 of a first embodiment, and FIG. 2 is a view showing a back sheet 2 of a second embodiment.

First Embodiment

A back sheet 1 of this embodiment is, as shown in FIG. 1, a laminate constituted by a fluororesin film 11, an adhesive layer 12 and a moisture-proof layer 13 laminated in this order.

The fluororesin film 11 is the outermost layer of the back sheet 1, which is a layer in contact with the outdoor air on a rear surface of a solar cell module. As the fluororesin film 11, the fluororesin film of the present invention is employed. The shape of the fluororesin film 11 is not particularly limited, and it may be appropriately selected according to the shape of the solar cell module to be employed.

The thickness of the fluororesin film 11 is preferably from 12 to 100 μm, more preferably from 20 to 50 μm. When the thickness of the fluororesin film 11 is at least 12 μm, it is easily suppress formation of a hole through the fluororesin film 11, and it is easy to obtain a sufficient effect of protecting a sealing resin such as EVA (ethylene-vinyl acetate copolymer) and a solar cell element of the solar cell module. Further, when the thickness of the fluororesin film 11 is at most 100 μm, it is possible to suppress the production cost.

The adhesive layer 12 is a layer for bonding the fluororesin film 11 and the moisture-proof layer 13.

As the adhesive agent forming the adhesive layer 12, an adhesive agent usually employed for a back sheet of a solar cell module may be employed, and from the viewpoint of excellent hydrolysis resistance, a two-component urethane type adhesive agent comprising a base compound and a curing agent is preferred.

The thickness of the adhesive layer 12 is preferably from 1 to 10 μm, more preferably from 2 to 5 μm. The thickness of the adhesive layer 12 is preferably thin, but if the thickness of the adhesive layer 12 is less than 1 μm, the bonding strength between the fluororesin film 11 and the moisture-proof layer 13 may become insufficient. When the thickness of the adhesive layer 12 is at least 1 μm, a bonding strength of at least 3 N/cm can be obtained.

The moisture-proof layer 13 plays a role of reducing the water vapor permeation amount of the back sheet 1 to improve moisture-proof property.

As the moisture-proof layer 13, a metal foil such as an aluminum foil or a moisture-proof plastic such as a moisture-proof polyethylene terephthalate may, for example, be mentioned.

The thickness of the moisture-proof layer 13 is preferably from 20 to 250 μm, more preferably from 50 to 200 μm.

Only a few such moisture-proof layers have only a moisture-proof effect, and a majority of such layers have an electric insulation performance at the same time. Specifically, there is e.g. a moisture-proof layer constituted by an aluminum foil having a thickness of from a few μm to about 20 μm and a PET film having a thickness of from 25 to about 150 μm laminated on one or each side of the aluminum foil; or a moisture-proof layer constituted by a plastic film such as a moisture-proof PET film having a thickness of from 60 to about 250 μm alone without having a metal foil such as an aluminum foil.

On a surface of the moisture-proof layer 13, a primer layer may be provided for the purpose of improving the adhesiveness with e.g. EVA being a sealing resin of the solar cell element of the solar cell module. As a primer agent for forming the primer layer, an acryl type primer, a polyester type primer or ethylene-vinyl acetate is preferred.

As a process for producing the back sheet 1, a known process may be used. For example, a process of subjecting a surface of the fluororesin film 11 to a corona discharge or plasma discharge treatment, and subsequently carrying out a lamination method by using the adhesive agent forming an adhesive layer 12 to form a laminate constituted by the fluororesin film 11, the adhesive layer 12 and a moisture-proof layer 13, to produce the back sheet 1, is mentioned.

Second Embodiment

A back sheet 2 of the second embodiment is, as shown in FIG. 2, constituted by a fluororesin film 11, an adhesive layer 12, a moisture-proof layer 13, an adhesive layer 14 and a fluororesin film 15 that are laminated in this order. The fluororesin film 11, the adhesive layer 12 and the moisture-proof layer 13 of the back sheet 2 are the same as those of the back sheet 1 of the first embodiment.

The adhesive layer 14 is a layer of bonding the moisture-proof layer 13 with the fluororesin film 15.

As an adhesive agent for forming the adhesive layer 14, the adhesive layer mentioned in the adhesive layer 12 of the first embodiment may be employed. Further, the preferred thickness of the adhesive layer 14 is also the same as that of the adhesive layer 12.

The fluororesin film 15 plays a role of further improving the effect of protecting a sealing resin such as EVA or a solar cell element of the solar cell module.

As the fluororesin film 15, in the same manner as the fluororesin film 11, the fluororesin film of the present invention may be employed. As an alternative, a white or black known fluororesin film employing an ETFE may be employed, as another alternative, a white or black known fluororesin film made of PVF or PVDF may be employed.

The thickness of the fluororesin film 15 is preferably from 12 to 100 μm, more preferably from 20 to 50 μm. When the thickness of the fluororesin film 15 is at least 12 μm, it is easy to obtain an effect of protecting a sealing resin such as EVA or a solar cell element of the solar cell module. Further, when the thickness of the fluororesin film 15 is at most 100 μm, it is possible to suppress the production cost.

On a surface of the fluororesin film 15, in the same manner as the back sheet 1 of the first embodiment, a primer layer may be formed for the purpose of improving the adhesiveness with e.g. EVA being a sealing resin for the solar cell element of the solar cell module.

As a process for producing the back sheet 2, a known method may be used, and in the same manner as the back sheet 1, a production process using a lamination method may be employed.

Since the back sheet of the present invention described above has the fluororesin film of the present invention as the outermost layer, the back sheet has a sufficient electric insulating property and weather resistance, and is particularly excellent in thermal resistance. Accordingly, the back sheet can maintain the quality of the solar cell module for a long time as compared with a conventional back sheet. Further, it is possible to suitably employ the back sheet as a back sheet for a solar cell module installed obliquely at an appropriate angle according to the latitude of installation site.

Here, the back sheet of the present invention is not limited to the examples of back sheet shown in FIGS. 1 and 2, and so long as the back sheet is a laminate employing the fluororesin film of the present invention as the outermost layer, the construction of the back sheet other than the fluororesin film may be any one of known various constructions.

EXAMPLES

Now, the present invention will be described in detail with reference to Examples and Comparative Examples. However, the present invention is not limited to the following descriptions. Further, a term "parts" in these Examples means "parts by mass".

[Evaluation Method]

A fluororesin film of this Example is evaluated with respect to the external appearance of film, optical properties, volume resistivity, rupture strength and elongation at rupture as shown below.

(External Appearance of Film)

With respect to the external appearance of film, presence or absence of poor dispersion of carbon black was visually inspected. A sample having no poor dispersion was ranked as "◯", a sample having poor dispersion was ranked as "X".

(Optical Properties)

By using a UV-PC3300 measurement instrument manufactured by Shimadzu Corporation, the visible light transmittance (%) according to JIS R3106 was measured to evaluate black concealing property. Further, in the same manner, a UV-light transmittance (%) at a wavelength of 360 nm was measured.

With respect to the black concealing property, when the visible light transmittance is less than 10%, the film is regarded to have a sufficient concealing property. Further, when the fluororesin film of the present invention is employed for a back sheet for solar cell, the UV light transmittance at 360 nm is required to be less than 1 μm in order to protect an adhesive agent.

(Volume Resistivity)

With respect to the volume resistivity ($10^{13}$ Ω·cm) of an obtained fluororesin film, a volume resistivity after application of a voltage of 500 V was measured by using a digital ultrahigh resistance/micro current meter R8340 (manufactured by ADC Corporation). Further, after an accelerated weather resistance test (SWM (sunshine weather meter), 5,000 hours) was carried out, or a thermal resistance of 230° C.×168 hours was carried out, the volume resistivity was measured in the same manner. The accelerated weather resistance test was carried out by using an accelerated weather resistance test apparatus (Suga Test Instruments Co., Ltd.: Sunshine 300), and with respect to the exposure condition, the black panel temperature was set to be 63° C.

With respect to electric insulation property, a high insulation performance is not required to a thin fluororesin film having a thickness of about 25 μm alone. However, a film whose volume resistivity changes by at least 10 times by the weather resistance test or the thermal resistance test was evaluated as not usable for a back sheet for solar cell.

(Rupture Strength and Elongation at Rupture)

By using a sample-rotation type gear oven (GPHH-101 manufactured by ESPEC Corp.), the obtained fluororesin film cut into a size of 7 cm×15 cm was put in the oven, it was further patterned into a dumbbell shape according to ASTM D638 TYPE V, and the rupture strength (MPa) and elongation at rupture (%) in the vertical direction (MD direction) and the lateral direction (TD direction) were measured. Further, the average of the values in the vertical direction and the value in the lateral direction of each of these properties was defined as the rupture strength or the elongation at rupture of the fluororesin film.

Further, in the same manner as the evaluation of volume resistivity, after the accelerated weather resistance test (SWM, 5,000 hours) or after the thermal resistance test of 230° C.×168 hours, the rupture strength and the elongation at rupture were measured, and the retention ratio (%) based on the value (initial value) before the test was calculated.

Now, Examples and Comparative Examples will be described.

Example 1

To 20 kg of Fluon C-88AX (ETFE resin, manufactured by Asahi Glass Company, Limited), 1 kg of DENKA black powder (acetylene black, manufactured by Denki Kagaku Kogyo K.K.) being a carbon black was blended, and they were sufficiently mixed. Subsequently, by using a 35 mm same direction twin extruder (TEM35, manufactured by Toshiba Machine Co., Ltd.), the mixture was extruded at a temperature of 320° C. at an extrusion amount of 20 kg/hour to obtain a black master batch containing 5.0 parts of carbon black based on 100 parts of ETFE. The specific surface area of the DENKA BLACK powder was 69 m²/g as measured by a method according to JIS K6217, and the pH was 9.5 as measured by a method according to JIS K6221 section 6.4.2 (hereinafter measurements are made by these methods).

The black master batch was dried at 150° C. for 1 hour, it was diluted by C-88AX so that the content of carbon black became 1.5 parts based on 100 parts of ETFE, to obtain a fluororesin film having a thickness of 25 μm. Shaping was carried out at 330° C. by using a 30 mm short axis extruder having a leading edge provided with a T die of 300 mm wide.

Examples 2 and 3

A fluororesin film was shaped in the same manner as Example 1 except that the black master batch of Example 1 was dried at 150° C. for 1 hour and diluted by C-88AX so that the carbon black content became 2.0 parts (Example 2) or 3.5 parts (Example 3) based on 100 parts of ETFE.

Examples 4 and 5

Instead of the DENKA BLACK powder, a predetermined amount of DENKA BLACK FX-35 (acetylene black, specific surface area 133 m²/g, pH 9.2, manufactured by Denki Kagaku Kogyo K.K.) was added to C-88AX, and they were sufficiently mixed. Subsequently, by using a 35 mm same direction twin screw extruder, the mixture was extruded at a temperature of 320° C. at an extrusion amount of 20 kg/hr, whereby the mixture was kneaded so that the carbon black content became 1.0 parts (Example 4) or 3.0 parts (Example 5) based on 100 parts of ETFE. Thereafter, it was shaped into a fluororesin film at 330° C. by using a 30 mm short axis extruder having a leading edge provided with a T die of 300 mm wide.

Example 6

Instead of the DENKA BLACK powder, a predetermined amount of carbon black #45L (furnace black, specific surface area 125 m²/g, pH 8.0, manufactured by Mitsubishi Chemical Corporation) was added to C-88AX, and they were sufficiently mixed. Subsequently, by using a 35 mm same direction twin screw extruder, the mixture was extruded at a temperature of 320° C. at an extrusion amount of 20 kg/hr, whereby the mixture was kneaded so that the carbon black content became 2.0 parts based on 100 parts of ETFE. Subsequently, the mixture was shaped into a fluororesin film at 330° C. by using a 30 mm short axis extruder having a leading edge provided with a T die of 300 mm wide.

Example 7

A fluororesin film was shaped in the same manner as Example 2 except that copper oxide was added at the time of diluting the black master batch of Example 1 so that the content of copper oxide became 50 ppm.

Example 8

A fluororesin film was shaped in the same manner as Example 2 except that copper iodide was added at the time of diluting the black master batch of Example 1 so that the content of copper iodide became 30 ppm.

Comparative Example 1

Without using carbon black, C-88AX (ETFE resin, manufactured by Asahi Glass Company, Limited) alone was employed and it was processed at 330° C. by using a 30 mm short axis extruder having a leading edge provided with a T die of 300 mm wide, to obtain a fluororesin film having a thickness of 25 μm.

Comparative Example 2

A fluororesin film was shaped in the same manner as Example 1 except that the black master batch of Example 1 was dried at 150° C. for 1 hour and diluted by C-88AX so that the carbon black content became 0.5 part based on 100 parts of ETFE.

Comparative Example 3

A fluororesin film was shaped in the same manner as Example 1 except that the black master batch of Example 1 was not diluted and used as it was so that the carbon black content became 5.0 parts based on 100 parts of ETFE.

Comparative examples 4 to 8

Instead of DENKA BLACK powder, carbon black MA100R (furnace black, specific surface area 110 m²/g, pH 3.5, manufactured by Mitsubishi Chemical Corporation) (Comparative Example 4), TOKABLACK #8500/F (furnace black, specific surface area 290 m²/g, pH 5.5, manufactured by Tokai Carbon Co., Ltd.) (Comparative Example 5), TOKABLACK #7550SB/F (furnace black, specific surface area 135 m²/g, pH 7.5, manufactured by Tokai Carbon Co., Ltd.) (Comparative Example 6), TOKABLACK #7360SB (furnace black, specific surface area 77 m²/g, pH 7.5, manufactured by Tokai Carbon Co., Ltd.) (Comparative Example 7) or TOKABLACK #4500 (furnace black, specific surface area 58 m²/g, pH 6.0, manufactured by Tokai Carbon Co., Ltd.) (Comparative Example 8) was employed. A predetermined amount of each type of carbon black was mixed into C-88AX, they were sufficiently mixed, the mixture was extruded at a temperature of 320° C. at an extrusion amount of 20 kg/hr by a 35 mm same direction twin screw extruder, whereby the mixture was kneaded so that the carbon black content became 2.0 parts based on 100 parts of ETFE, to obtain a pellet. The obtained pellet was processed at 330° C. by using a 30 mm short axis extruder having a leading edge provided with a T die of 300 mm wide, to shape a fluororesin film.

Comparative Example 9

A fluororesin film was formed in the same manner as Comparative Examples 4 to 8 except that besides the carbon black (one employed in Comparative Example 6 was employed), copper iodide was added so that its content became 50 ppm.

Figure 3:
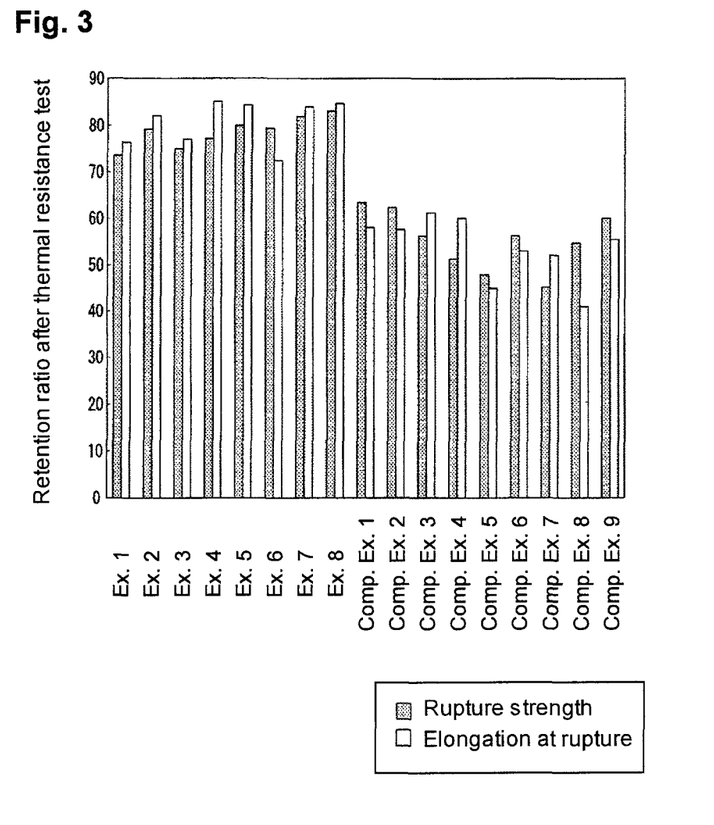
FIG. 3 is a view showing retention rates of rupture strength and elongation at rupture of the fluororesin film of this Example after a thermal resistance test.

Evaluation results of fluororesin films of Examples 1 to 8 and Comparative Examples 1 to 9 are shown in Table 1 and FIG. 3. Here, in Table 1, "AB" means acetylene black, and "FB" means furnace black.

TABLE 1

|  |  | Example | | | | | | | |
|---|---|---|---|---|---|---|---|---|---|
|  |  | 1 | 2 | 3 | 4 | 5 | 6 | 7 | 8 |
| Carbon black | Type | AB | AB | AB | AB | AB | FB | AB | AB |
|  | Specific surface area [m²/g] | 69 | 69 | 69 | 133 | 133 | 125 | 69 | 69 |
|  | pH | 9.5 | 9.5 | 9.5 | 9.2 | 9.2 | 8.0 | 9.5 | 9.5 |
|  | Content [parts by mass] | 1.5 | 2.0 | 3.5 | 1.0 | 3.0 | 2.0 | 2.0 | 2.0 |
| Copper compound | CuO [ppm] | — | — | — | — | — | — | 50 | — |
|  | CuI [ppm] | — | — | — | — | — | — | — | 30 |
| Film | Thickness [μm] | 25 | 25 | 25 | 25 | 25 | 25 | 25 | 25 |
|  | External appearance | ○ | ○ | ○ | ○ | ○ | ○ | ○ | ○ |
| Initial optical property | 360 nm transmittance [%] | 0.1 | 0.1 | 0.05 | 0.1 | 0.05 | 0.05 | 0.08 | 0.08 |
|  | Visible light transmittance [%] | 0.2 | 0.1 | 0.05 | 0.1 | 0.05 | 0.05 | 0.10 | 0.10 |
| Volume specific surface area [$10^{13}$ Ω·cm] | Initial | 62 | 32 | 10 | 82 | 2.0 | 24 | 30 | 34 |
|  | After SWM 5000 hrs | 66 | 33 | 12 | 62 | 5.0 | 34 | 30 | 34 |
|  | After 230° C. × 168 hrs | 80 | 23 | 26 | 24 | 10 | 11 | 22 | 25 |
| Rupture strength | Initial [MPa] | 65 | 66 | 67 | 62 | 60 | 58 | 66 | 66 |
|  | Retention ratio [%] after SWM 5000 hrs | 100 | 98 | 97 | 97 | 92 | 90 | 97 | 98 |
|  | Retention ratio [%] after 230° C. × 168 hrs | 73 | 79 | 75 | 77 | 80 | 79 | 82 | 83 |
| Elongation at rupture | Initial [%] | 350 | 330 | 310 | 260 | 250 | 240 | 330 | 330 |
|  | Retention ratio [%] after SWM 5000 hrs | 100 | 95 | 90 | 92 | 88 | 83 | 95 | 95 |
|  | Retention ratio [%] after 230° C. × 168 hrs | 76 | 82 | 77 | 85 | 84 | 72 | 84 | 84 |

|  |  | Comparative Example | | | | | | | | |
|---|---|---|---|---|---|---|---|---|---|---|
|  |  | 1 | 2 | 3 | 4 | 5 | 6 | 7 | 8 | 9 |
| Carbon black | Type | — | AB | AB | FB | FB | FB | FB | FB | FB |
|  | Specific surface area [m²/g] | — | 69 | 69 | 110 | 290 | 135 | 77 | 58 | 135 |
|  | pH | — | 9.5 | 9.5 | 3.5 | 5.5 | 7.5 | 7.5 | 6.0 | 7.5 |
|  | Content [parts by mass] | — | 0.5 | 5.0 | 2.0 | 2.0 | 2.0 | 2.0 | 2.0 | 2.0 |
| Copper compound | CuO [ppm] | — | — | — | — | — | — | — | — | — |
|  | CuI [ppm] | — | — | — | — | — | — | — | — | 50 |
| Film | Thickness [μm] | 25 | 25 | 25 | 25 | 25 | 25 | 25 | 25 | 25 |
|  | External appearance | ○ | ○ | ○ | ○ | X | ○ | ○ | ○ | ○ |
| Initial optical property | 360 nm transmittance [%] | 87 | 0.3 | 0.05 | 0.05 | 0.35 | 0.05 | 0.1 | 0.1 | 0.04 |
|  | Visible light transmittance [%] | 96 | 0.3 | 0.05 | 0.05 | 0.3 | 0.05 | 0.1 | 0.05 | 0.05 |
| Volume specific surface area [$10^{13}$ Ω·cm] | Initial | 160 | 35 | 9.8 | 6.7 | 10 | 69 | 45 | 29 | 60 |
|  | After SWM 5000 hrs | 160 | 50 | 8.5 | 8.9 | 25 | 25 | 62 | 35 | 15 |
|  | After 230° C. × 168 hrs | 200 | 45 | 7.0 | 7.0 | 32 | 20 | 35 | 8 | 25 |
| Rupture strength | Initial [MPa] | 64 | 66 | 68 | 62 | 52 | 62 | 66 | 62 | 62 |
|  | Retention ratio [%] after SWM 5000 hrs | 94 | 100 | 88 | 89 | 76 | 97 | 88 | 92 | 97 |
|  | Retention ratio [%] after 230° C. × 168 hrs | 63 | 62 | 56 | 51 | 48 | 56 | 45 | 55 | 60 |
| Elongation at rupture | Initial [%] | 340 | 330 | 300 | 360 | 220 | 340 | 330 | 280 | 340 |
|  | Retention ratio [%] after SWM 5000 hrs | 88 | 100 | 87 | 89 | 75 | 88 | 91 | 79 | 88 |
|  | Retention ratio [%] after 230° C. × 168 hrs | 58 | 57 | 61 | 60 | 45 | 53 | 52 | 41 | 56 |

As shown in Table 1 and FIG. 3, in each of fluororesin films of Examples 1 to 8 containing from 1.0 to 3.5 parts of carbon black having a pH of from 8 to 10 based on 100 parts of ETFE, the retention ratios of rupture strength and elongation at rupture after accelerated weather resistance test were high, and the retention ratios of rupture strength and elongation at rupture after the thermal resistance test was extremely high as compared with the sample of Comparative Example 1 containing no carbon black. These results indicate that a specific carbon black contained in the fluororesin film improves the weather resistance and the thermal resistance of the film. Further, in Examples 7 and 8, copper oxide or copper iodide contained in the film further improves the thermal resistance as compared with Example 2.

Further, in each of the fluororesin films of Examples 1 to 8, the carbon black was sufficiently dispersed, and the UV light transmittance at a wavelength of 360 nm and the visible light transmittance were both at most 0.1% (except for visible light transmittance of Example 1). Accordingly, these fluororesin films were excellent in the light resistance and had sufficient concealing property.

Further, each of the fluororesin films of Examples 1 to 8 had a volume resistivity of at least $1 \times 10^{13}$ Ω·cm and thus had a sufficient electric insulation property, and the value did not change remarkably by the accelerated weather resistance test or the thermal resistance test.

On the other hand, in Comparative Example 2 wherein the amount of carbon black was as little as 0.5 part, the rupture strength and the elongation at rupture were sufficiently maintained through the accelerated weather resistance test, but the breaking strength and the elongation at rupture were remarkably decreased by the thermal resistance test, and there was no improvement in the thermal resistance as compared with a case (Comparative Example 1) containing no carbon black.

Further, in Comparative Example 3 wherein the amount of carbon black was as much as 5.0 parts, the rupture strength and the elongation at rupture were maintained to a certain extent through the accelerated weather resistance test, but the rupture strength and the elongation at rupture were remarkably decreased by the thermal resistance test, and there was no improvement in the thermal resistance.

Further, in Comparative Example 4 to 9 wherein pH of the employed carbon black was less than 8, some example showed decrease of rupture strength and elongation at rupture by the accelerated weather resistance test, and the rupture strength and the elongation at rupture were remarkably decreased by the thermal resistance test. Particularly, in Comparative Example 5 wherein the employed carbon black had a specific surface area of 290 m$^2$/g and a pH of 5.5, the dispersion state of carbon black was poor, and both of the weather resistance and the thermal resistance were low. Further, in Comparative Example 9, although the film contained copper iodide, its thermal resistance was low.

INDUSTRIAL APPLICABILITY

The dark type fluororesin film of the present invention is excellent in hydrolysis resistance, electric insulation property, light resistance and weather resistance, the film transmits little water vapor and it is particularly excellent in thermal resistance. Accordingly, the film can be suitably employed as a back sheet for a solar cell module installed obliquely at an optimum angle according to the latitude of installation site.

The entire disclosure of Japanese Patent Application No. 2008-262581 filed on Oct. 9, 2008 including specification, claims, drawings and summary is incorporated herein by reference in its entirety.

REFERENCE SYMBOLS

1, 2: Back sheet, 11: Fluororesin film, 12: Adhesive layer, 13: Moisture-proof layer, 14: Adhesive layer and 15: Fluororesin film

What is claimed is:

1. A fluororesin film, which comprises an ethylene-tetrafluoroethylene copolymer as the main component and contains from 1.0 to 4.5 parts by mass of a carbon black having a pH of from 8 to 10 as measured according to JIS K6221 section 6.4.2 based on 100 parts by mass of the ethylene-tetrafluoroethylene copolymer, which fluororesin film has a volume resistivity of at least $1\times10^{13}$ Ω·cm, wherein the fluororesin film has a thickness of from 12 to 100 μm.

2. The fluororesin film according to claim 1, wherein the carbon black has a specific surface area of from 30 to 150 m$^2$/g in terms of nitrogen adsorption as measured according to JIS K6217.

3. A back sheet for a solar cell module comprising a laminate having the fluororesin film as defined in claim 1 wherein the carbon black is an acetylene black or a furnace black.

4. A solar cell module comprising the back sheet as defined in claim 3.

5. A back sheet for a solar cell module comprising a laminate having the fluororesin film as defined in claim 1, wherein the fluororesin film further contains a copper compound in an amount of from $1\times10^{-4}$ to $5\times10^{-2}$ parts by mass based on 100 parts by mass of the ethylene-tetrafluoroethylene copolymer.

6. The back sheet for a solar cell module comprising a laminate having the fluororesin film as defined in claim 5, wherein the copper compound is present in an amount of 10 to 200 ppm by mass based on 100 parts by mass of the ethylene-tetrafluoroethylene copolymer.

7. A back sheet for a solar cell module comprising a laminate having the fluororesin film as defined in claim 1, wherein the fluororesin film has a transmittance of less than 1% for UV rays having a wavelength of 360 nm or shorter.

8. A back sheet for a solar cell module comprising a laminate having the fluororesin film as defined in claim 1 as the outermost layer of the back sheet.

9. The back sheet for a solar cell module according to claim 8, wherein the laminate comprises the fluororesin film, an adhesive layer and a moisture-proof layer laminated in this order.

10. The back sheet for a solar cell module according to claim 8, wherein the laminate comprises the fluororesin film, an adhesive layer, a moisture-proof layer and a fluororesin film laminated in this order.

11. The back sheet for a solar cell module according to claim 8, wherein the fluororesin film has a thickness of from 20 to 50 μm.

12. A back sheet for a solar cell module comprising a laminate having the fluororesin film as defined in claim 1, wherein the ethylene-tetrafluoroethylene copolymer is the only resin component of the fluororesin film.

13. A back sheet for a solar cell module comprising a laminate having the fluororesin film as defined in claim 1, wherein the amount of carbon black is from 1.5 to 3.0 parts by mass.

14. A back sheet for a solar cell module comprising a laminate having the fluororesin film as defined in claim 1, wherein the fluororesin film has a transmittance of at most 0.1% for UV rays having a wavelength of 360 nm or shorter.

15. A back sheet for a solar cell module comprising a laminate having the fluororesin film as defined in claim 1, wherein the volume resistivity is at least $1\times10^{14}$ Ω·cm.

16. A back sheet for a solar cell module comprising a laminate having the fluororesin film as defined in claim 1, wherein the pH is from 9 to 10.

17. A back sheet for a solar cell module comprising a laminate having the fluororesin film as defined in claim 1, wherein the carbon black has a specific surface area of from 40 to 135 m$^2$/g in terms of nitrogen adsorption as measured according to JIS K6217.

* * * * *